(12) United States Patent
Li et al.

(10) Patent No.: US 10,431,581 B1
(45) Date of Patent: Oct. 1, 2019

(54) COMPLEMENTARY METAL-OXIDE SEMICONDUCTOR (CMOS) INTEGRATION WITH COMPOUND SEMICONDUCTOR DEVICES

(71) Applicant: QUALCOMM Incorporated, San Diego, CA (US)

(72) Inventors: Xia Li, San Diego, CA (US); Gengming Tao, San Diego, CA (US); Bin Yang, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 15/966,225

(22) Filed: Apr. 30, 2018

(51) Int. Cl.
| | |
|---|---|
| H01L 27/06 | (2006.01) |
| H01L 27/092 | (2006.01) |
| H01L 29/205 | (2006.01) |
| H01L 29/225 | (2006.01) |
| H01L 21/8249 | (2006.01) |
| H01L 29/66 | (2006.01) |
| H01L 21/8238 | (2006.01) |
| H01L 29/737 | (2006.01) |

(52) U.S. Cl.
CPC ...... *H01L 27/0623* (2013.01); *H01L 21/8249* (2013.01); *H01L 21/823821* (2013.01); *H01L 27/0924* (2013.01); *H01L 29/205* (2013.01); *H01L 29/225* (2013.01); *H01L 29/66318* (2013.01); *H01L 29/66969* (2013.01); *H01L 29/7371* (2013.01)

(58) Field of Classification Search
CPC ............. H01L 27/0623; H01L 27/0647; H01L 27/0924; H01L 29/205; H01L 29/225
See application file for complete search history.

(56) References Cited

U.S. PATENT DOCUMENTS

| | | | |
|---|---|---|---|
| 8,652,894 | B2 | 2/2014 | Lin et al. |
| 9,460,991 | B1 | 10/2016 | Or-Bach et al. |
| 9,496,401 | B1 | 11/2016 | Cheng et al. |
| 9,515,090 | B2 | 12/2016 | Caimi et al. |
| 9,818,872 | B2 | 11/2017 | Ching et al. |
| 2009/0309167 | A1* | 12/2009 | Russ .................. H01L 21/8249 257/370 |

* cited by examiner

*Primary Examiner* — Hoai V Pham
(74) *Attorney, Agent, or Firm* — Patterson & Sheridan, L.L.P

(57) ABSTRACT

Certain aspects of the present disclosure provide a semiconductor device. One example semiconductor device generally includes a substrate, a well region disposed adjacent to the substrate, a first fin disposed above the well region, a second fin disposed above the substrate, and a gate region disposed adjacent to each of the first fin and the second fin. The semiconductor device may also include at least one third fin disposed above the substrate, a support layer disposed above the at least one third fin, and a compound semiconductor device disposed above the support layer.

29 Claims, 21 Drawing Sheets

COMPLEMENTARY METAL-OXIDE SEMICONDUCTOR (CMOS) INTEGRATION WITH COMPOUND SEMICONDUCTOR DEVICES

TECHNICAL FIELD

Certain aspects of the present disclosure generally relate to electronic circuits and, more particularly, to semiconductor devices.

BACKGROUND

Complementary metal-oxide semiconductor (CMOS) devices are fundamental components for integrated circuits to implement digital logic. A CMOS device typically includes a p-type metal-oxide semiconductor (PMOS) used to pull an output to logic high and an n-type metal-oxide semiconductor (NMOS) used to pull the output down to logic low, depending on an input signal provided to the gates of the PMOS and NMOS transistors.

Compound semiconductor devices are often used in radio frequency (RF) applications and provide several advantages over regular semiconductor devices. For example, compound semiconductor devices can operate at lower voltages as compared to regular semiconductor devices, and electrons in compound semiconductor devices move faster than electrons in silicon, allowing faster processing speeds.

SUMMARY

Certain aspects of the present disclosure generally relate to a structure for a semiconductor device that allows for a complementary metal-oxide semiconductor (CMOS) device and a compound semiconductor device to be on the same wafer-level substrate.

Certain aspects of the present disclosure are directed to a semiconductor device. The semiconductor device generally includes a substrate, a well region disposed adjacent to the substrate, a first fin disposed above the well region, a second fin disposed above the substrate, a gate region disposed adjacent to each of the first fin and the second fin, at least one third fin disposed above the substrate, a support layer disposed above the at least one third fin, and a compound semiconductor device disposed above the support layer.

Certain aspects of the present disclosure are directed to a semiconductor device. The semiconductor device generally includes a substrate; a well region disposed adjacent to the substrate; a first fin disposed above the well region; a second fin disposed above the substrate, the first fin and the second fin having different doping types; a first non-insulative gate region disposed adjacent to the first fin, the first non-insulative gate region having a different doping type than the first fin; a second non-insulative gate region disposed adjacent to the second fin, the second non-insulative gate region having a different doping type than the second fin; at least one third fin disposed above the substrate; a support layer disposed above the at least one third fin; and a compound semiconductor device disposed above the support layer.

Certain aspects of the present disclosure are directed to a method for fabricating a semiconductor device. The method generally includes forming a substrate, forming a well region adjacent to the substrate, forming a first fin above the well region, forming a second fin above the substrate, forming at least one third fin above the substrate, forming a gate region adjacent to each of the first fin and the second fin, forming a support layer above the at least one third fin, and forming a compound semiconductor device above the support layer.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a complementary metal-oxide semiconductor (CMOS) hybrid integration with a compound semiconductor device.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Semiconductor Device

Complementary metal-oxide semiconductor (CMOS) logic technology may not integrate well with radio frequency (RF) compound semiconductor devices. One solution is to use a separate logic chip having CMOS devices and a separate RF compound chip; however, using separate chips results in increased cost and area consumption. Certain aspects of the present disclosure are generally directed to a semiconductor structure that allows CMOS devices and compound semiconductor devices to be implemented on the same chip (e.g., share the same wafer-level substrate).

Figure 1:
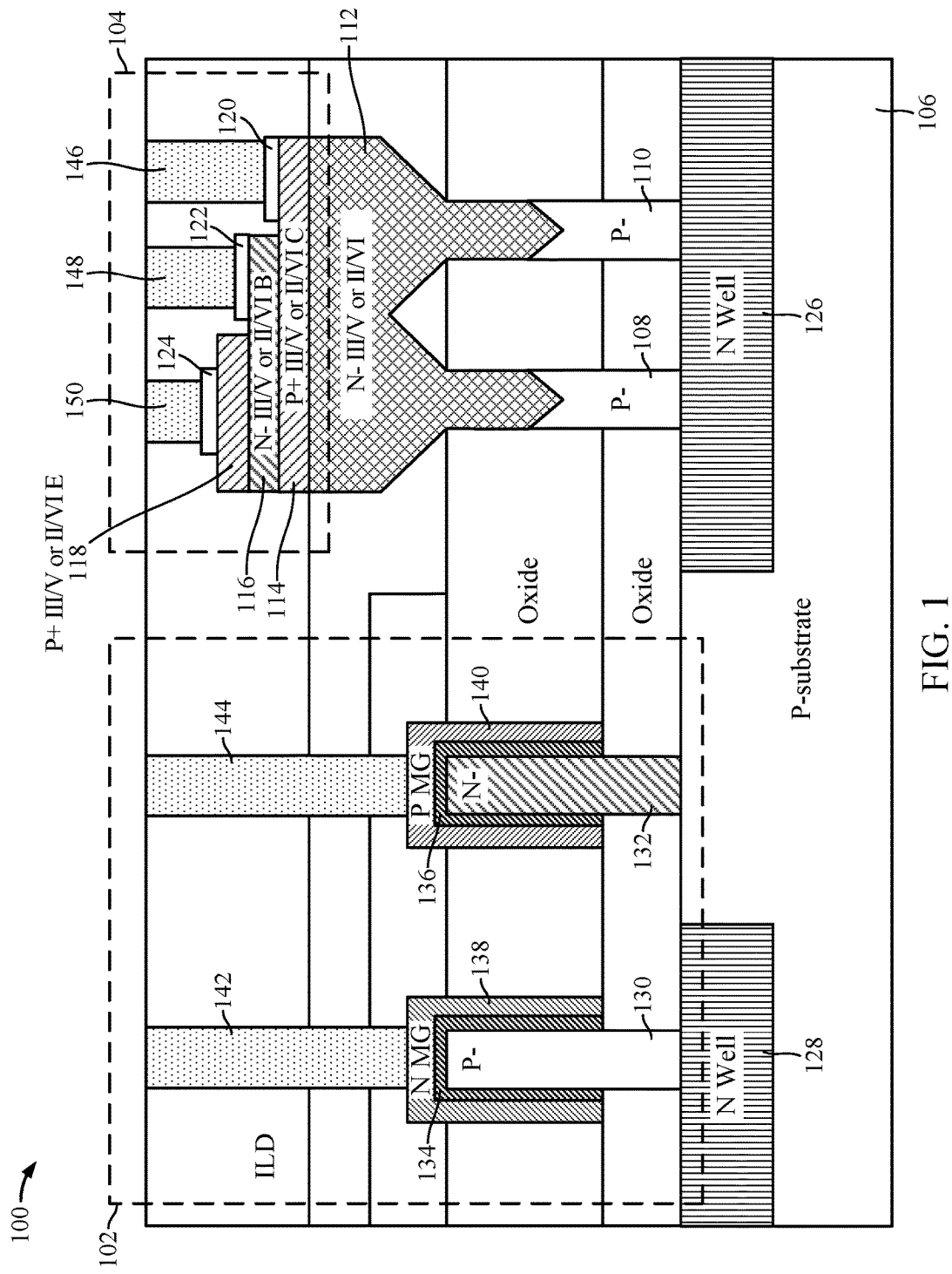
FIG. 1 illustrates a semiconductor device having a complementary metal-oxide semiconductor (CMOS) device and a compound semiconductor device implemented as a P region/N region/P region (PNP) heterojunction bipolar transistor (HBT) device, in accordance with certain aspects of the present disclosure.

FIG. 1 illustrates a semiconductor device 100 having a CMOS device 102 and a compound semiconductor device 104 implemented as a P region/N region/P region (PNP) heterojunction bipolar transistor (HBT) device, in accordance with certain aspects of the present disclosure. As illustrated, the CMOS device 102 includes a fin field-effect transistor (FinFET) n-type metal-oxide semiconductor (NMOS) device and a FinFET p-type metal-oxide semiconductor (PMOS) device which are implemented over a substrate 106.

The compound semiconductor device 104 may be a FinFET hybrid PNP HBT device implemented over the same substrate 106 as the CMOS device 102, as illustrated. The compound semiconductor device 104 is disposed over P-fins 108 and 110 and a support layer 112 for supporting the compound semiconductor device 104. The fins 108 and 110 are formed above an N well region 126.

The compound semiconductor device 104 includes compound semiconductor regions 114, 116, and 118, which are doped as p-type, n-type, and p-type, respectively, to form a PNP HBT device. In certain aspects, the compound semiconductor regions 114, 116, and 118 may be formed using a compound semiconductor material such as a group III/V semiconductor or a group II/VI semiconductor, as illustrated. The compound semiconductor region 114 forms the collector (C) of the HBT device, the semiconductor region 116 forms the base (B) of the HBT device, and the semiconductor region 118 forms the emitter (E) of the HBT device, as illustrated. Metal layers 120, 122, and 124 are formed above compound semiconductor regions 114, 116, and 118, respectively, for coupling to respective contacts 146, 148, and 150.

The CMOS device 102 includes a fin 130 (e.g., p-type fin) and a fin 132 (e.g., n-type fin), each disposed adjacent to a respective oxide layer 134 and 136 (e.g., gate dielectric regions). For example, the oxide layer 134 may be formed adjacent to at least three sides of the fin 130, and the oxide layer 136 may be formed adjacent to at least three sides of the fin 132. The oxide layers 134 and 136 electrically isolate the fins 130 and 132 from the metal gate region 138 (e.g., n-type metal gate region) and the metal gate region 140 (e.g., p-type metal gate region), respectively. Therefore, the fin 130, the oxide layer 134, and metal gate region 138 form an NMOS device, and the fin 132, oxide layer 136, and the metal gate region 140 form a PMOS device. Contacts 142 and 144 are used to make an electrical connection to the metal gate region 138 and the metal gate region 140, respectively. Fin 130 may be formed above an N well region 128, as illustrated. While the examples provided herein illustrate a metal gate region to facilitate understanding, any non-insulative region may be used. As used herein, a non-insulative region (e.g., non-insulative gate region) generally refers to a region that may be conductive or semiconductive.

Figure 2:
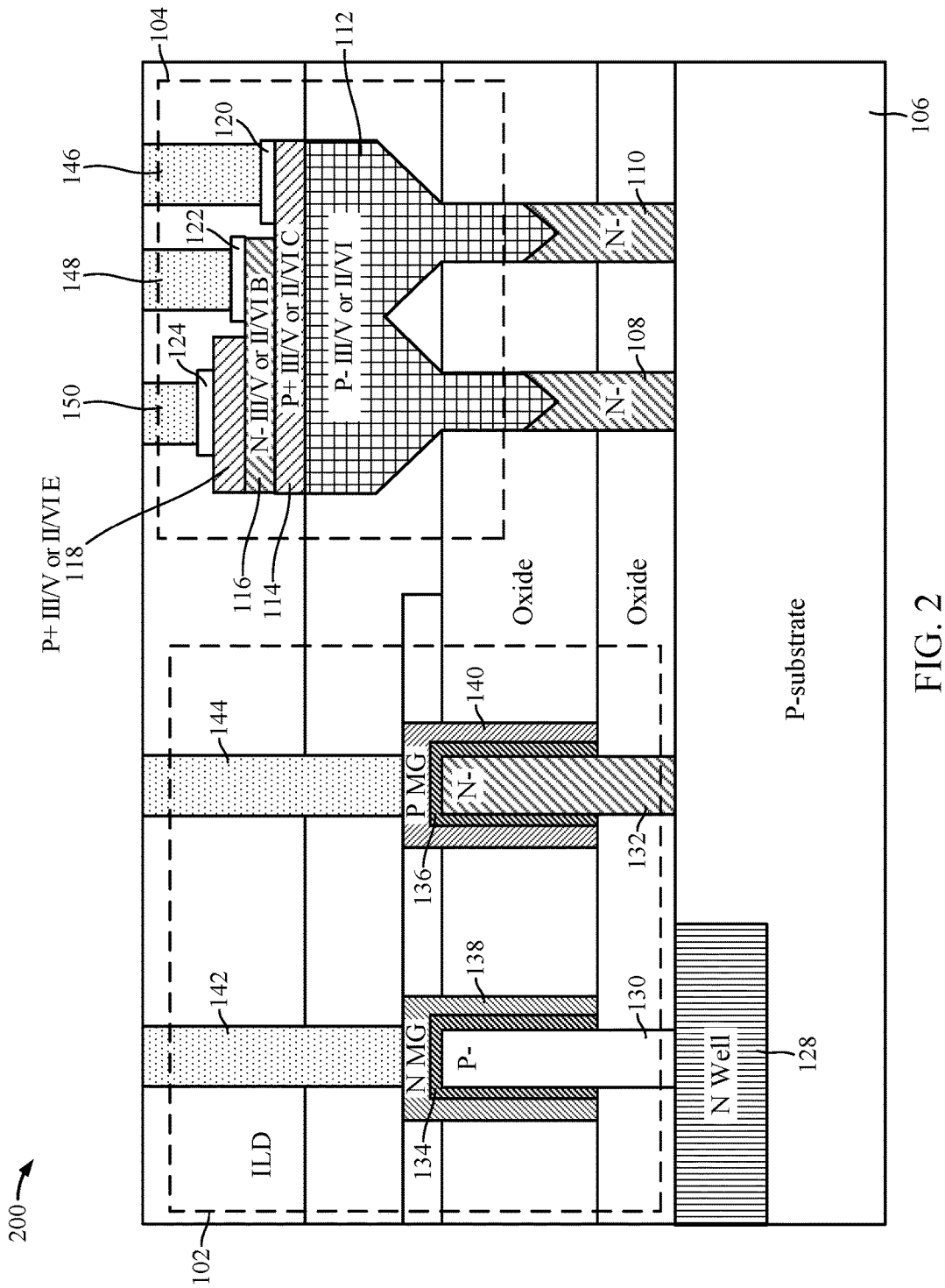
FIG. 2 illustrates a semiconductor device having a CMOS device and a compound semiconductor device implemented as a PNP HBT device on a p-type support layer, in accordance with certain aspects of the present disclosure.

FIG. 2 illustrates a semiconductor device 200 having a CMOS device 102 and a compound semiconductor device 104 implemented as a PNP HBT device on a p-type support layer, in accordance with certain aspects of the present disclosure. The semiconductor device 200 is similar to the semiconductor device 100, but the fins 108 and 110 and the support layer 112 are implemented as n-type fins and a p-type support layer, respectively. Also, there may be no N well region 126 beneath the fins 108 and 110 in the semiconductor device 200.

Figure 3:
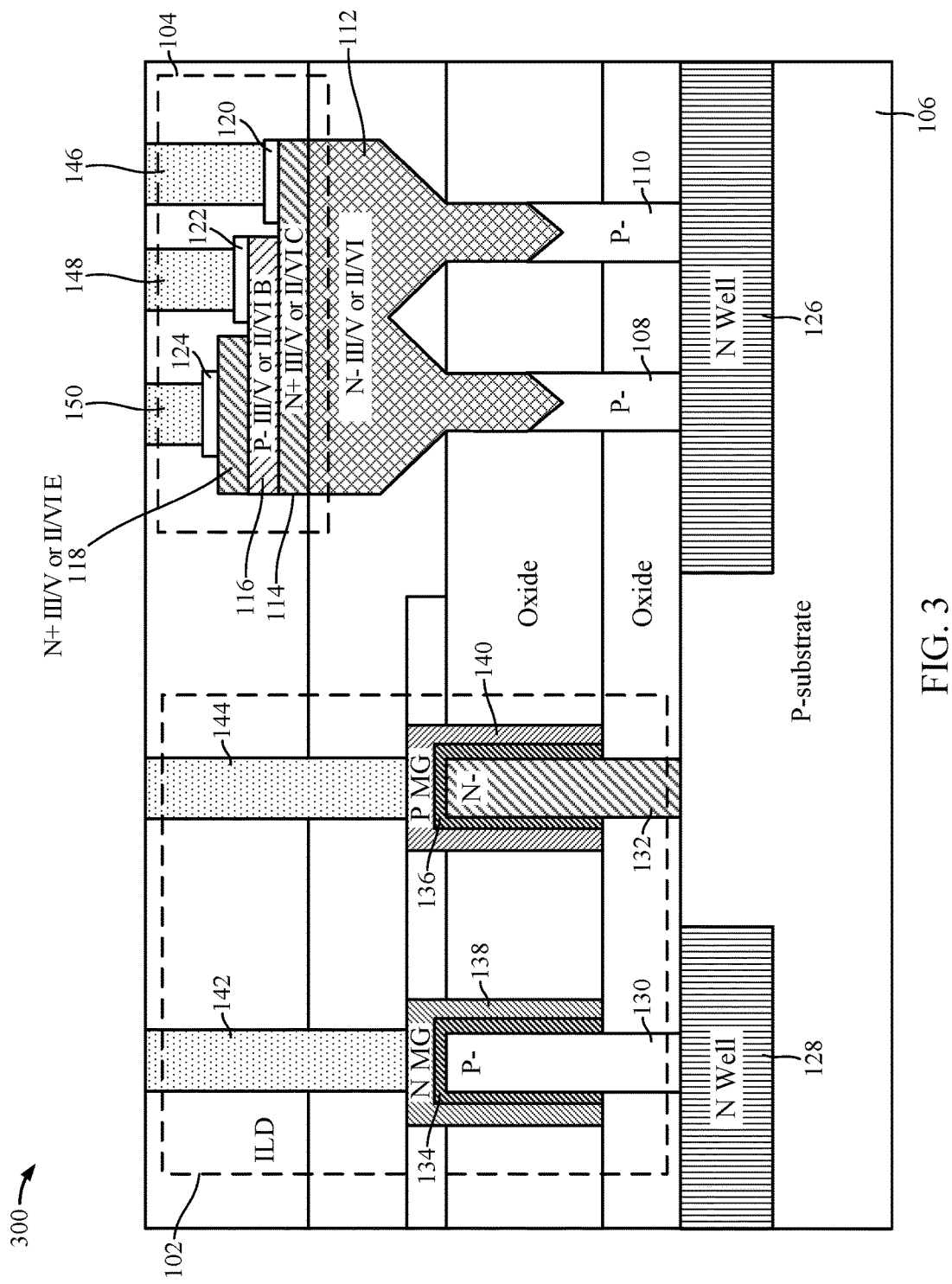
FIG. 3 illustrates a semiconductor device having a CMOS device and a compound semiconductor device implemented as an N region/P region/N region (NPN) HBT device on an n-type support layer, in accordance with certain aspects of the present disclosure.

FIG. 3 illustrates a semiconductor device 300 having a CMOS device 102 and a compound semiconductor device 104 implemented as a N region/P region/N region (NPN) HBT device on an n-type support layer, in accordance with certain aspects of the present disclosure. The semiconductor device 300 is similar to the semiconductor device 100, but the n-type semiconductor regions of the compound semiconductor device 104 are replaced with p-type semiconductor regions, and vice versa.

Figure 4:
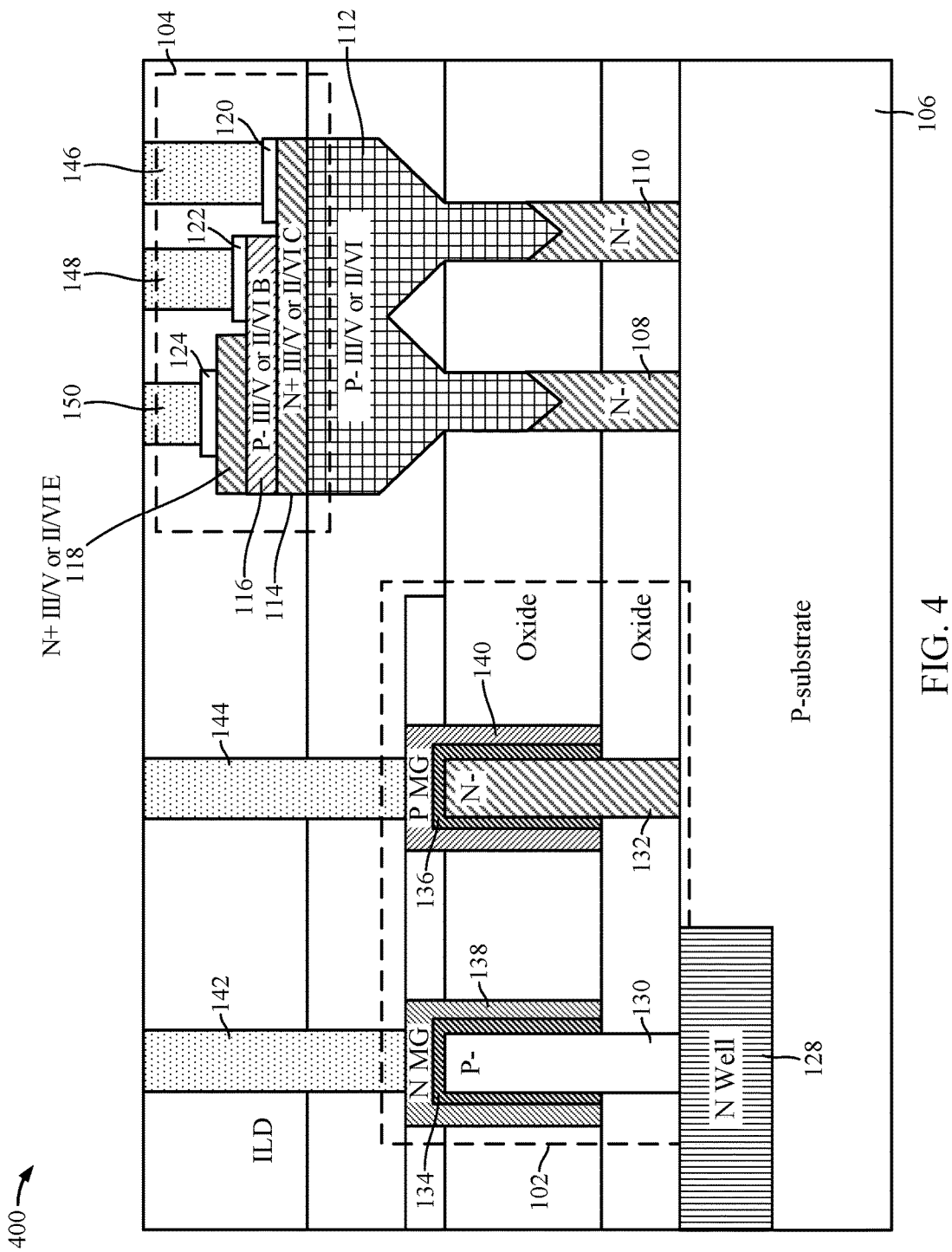
FIG. 4 illustrates a semiconductor device having a CMOS device and a compound semiconductor device implemented as a NPN HBT device on a p-type support layer, in accordance with certain aspects of the present disclosure.

FIG. 4 illustrates a semiconductor device 400 having a CMOS device 102 and a compound semiconductor device 104 implemented as a NPN HBT device on a p-type support layer, in accordance with certain aspects of the present disclosure. The semiconductor device 400 is similar to the semiconductor device 300, but the fins 108 and 110 and the support layer 112 are implemented as n-type fins and a p-type support layer, respectively. Also, there may be no N well region 126 beneath the fins 108 and 110 in the semiconductor device 400.

Figure 5A:
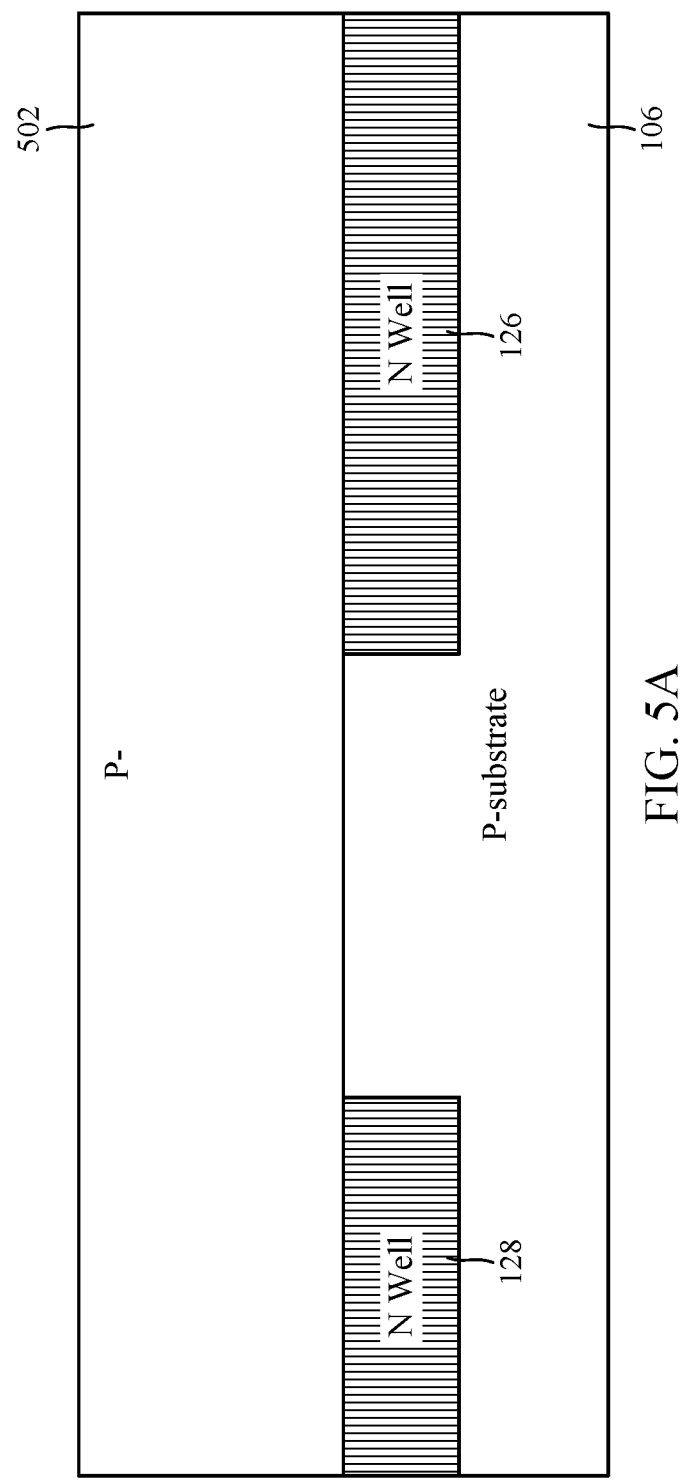
FIGS. 5A-5P illustrate example fabrication processes to implement a semiconductor device, in accordance with certain aspects of the present disclosure.
Figure 5B:
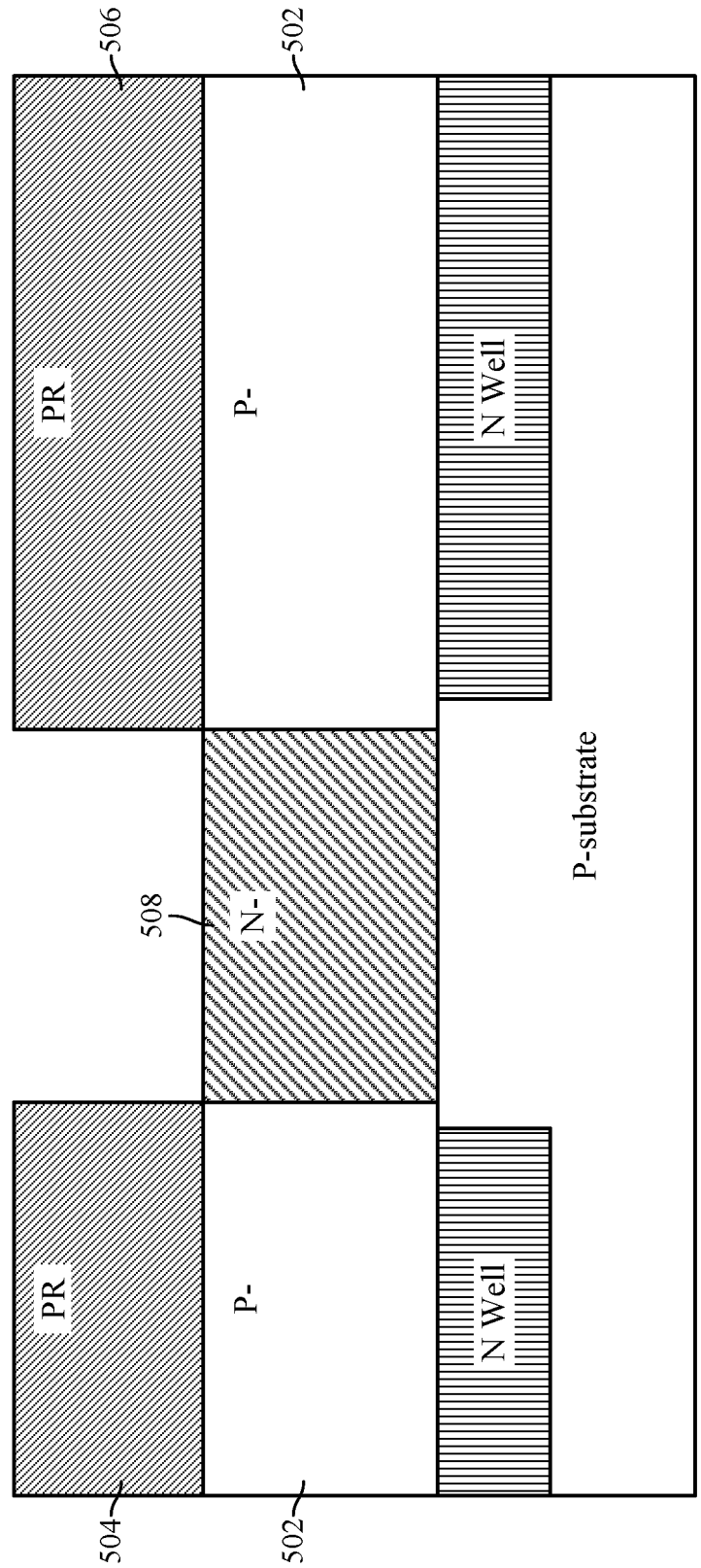
Figure 5C:
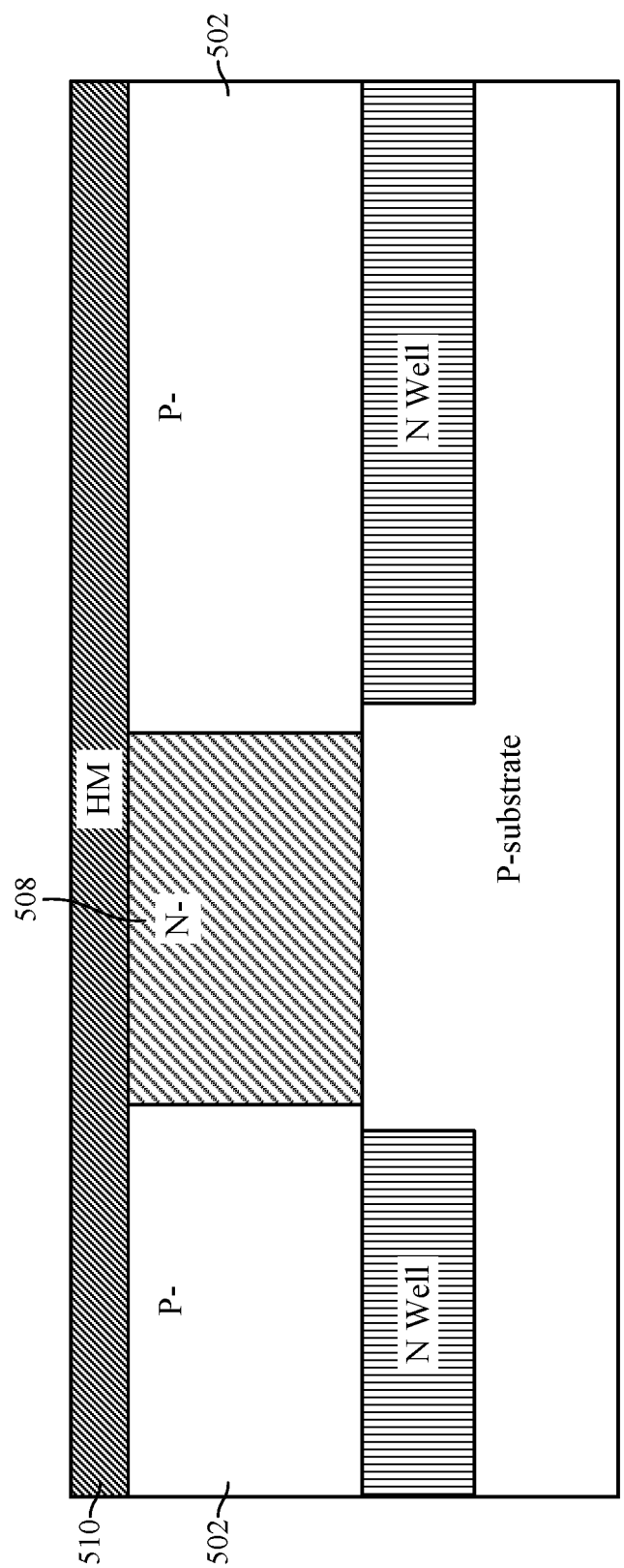
Figure 5D:
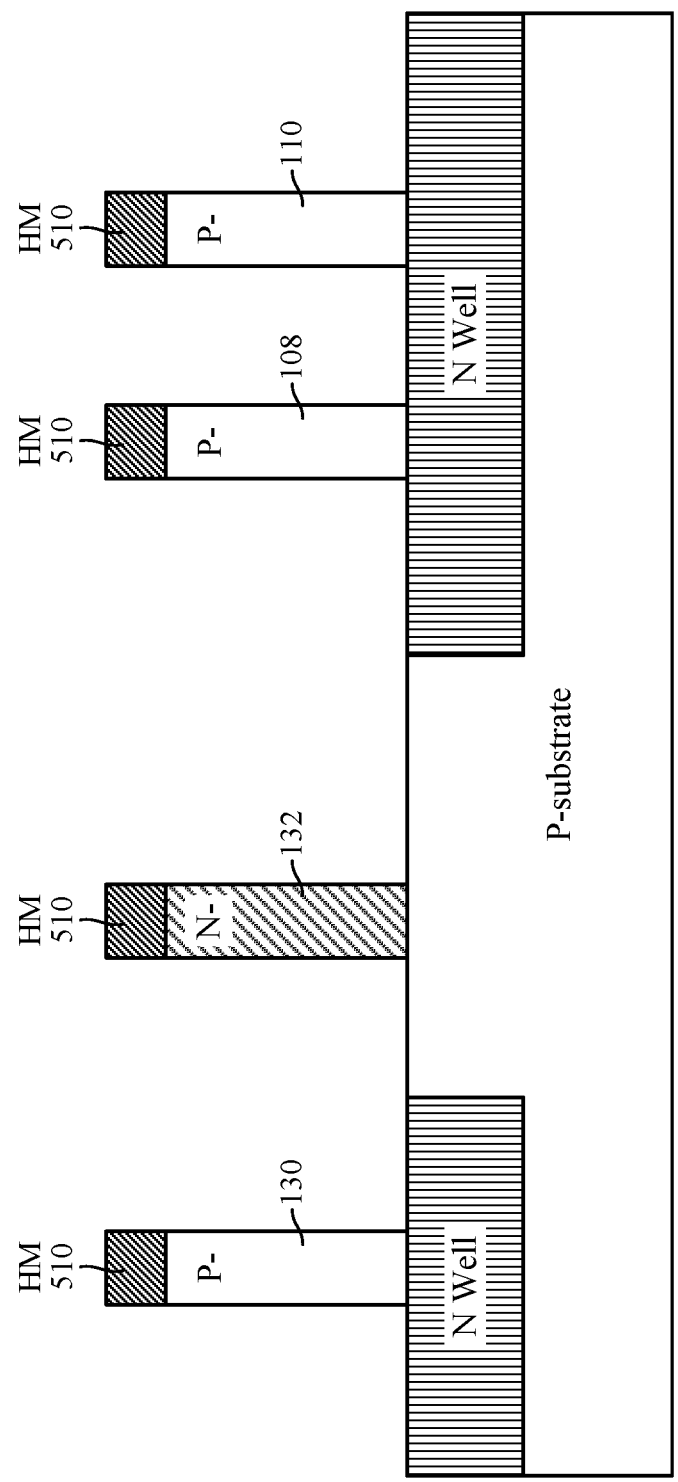
Figure 5E:
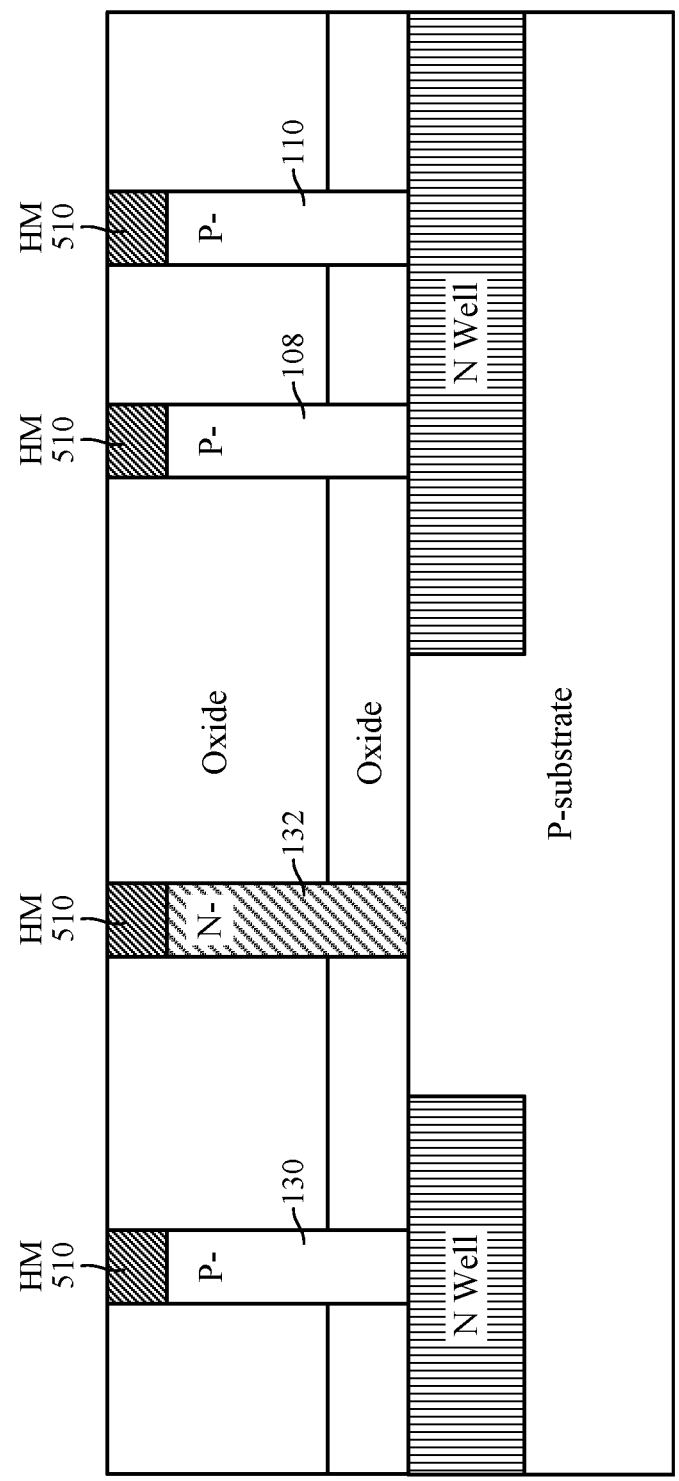
Figure 5F:
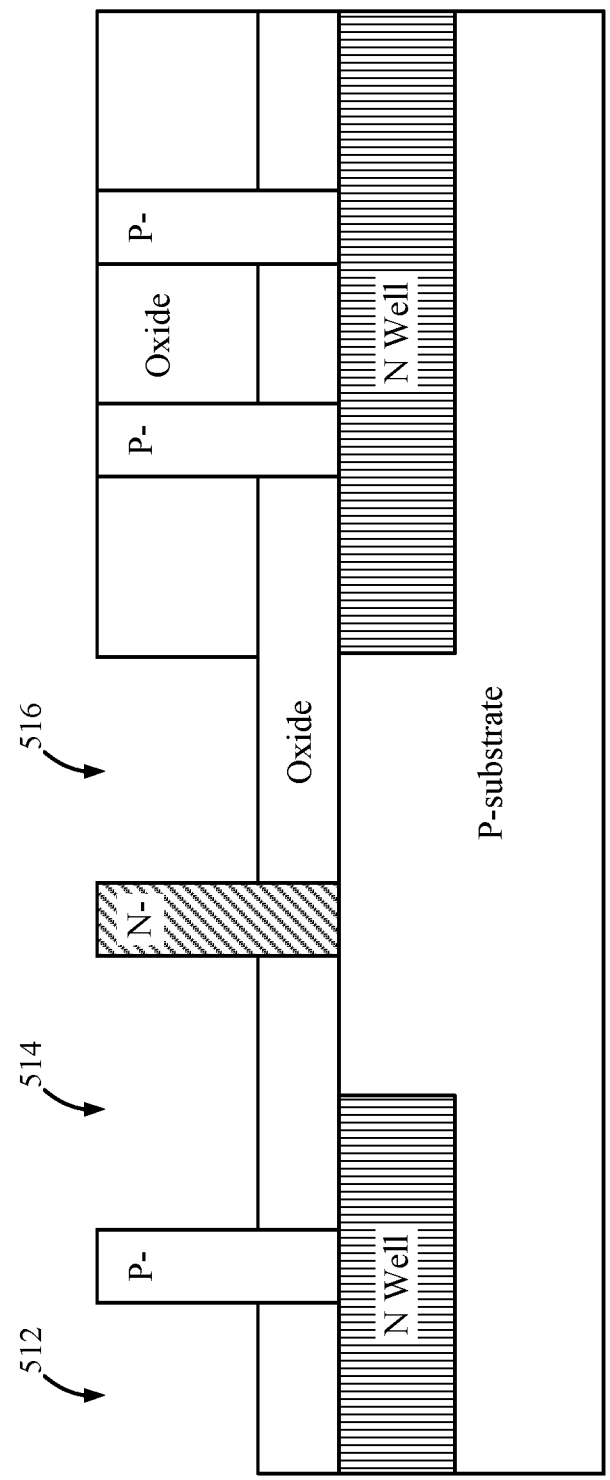
Figure 5G:
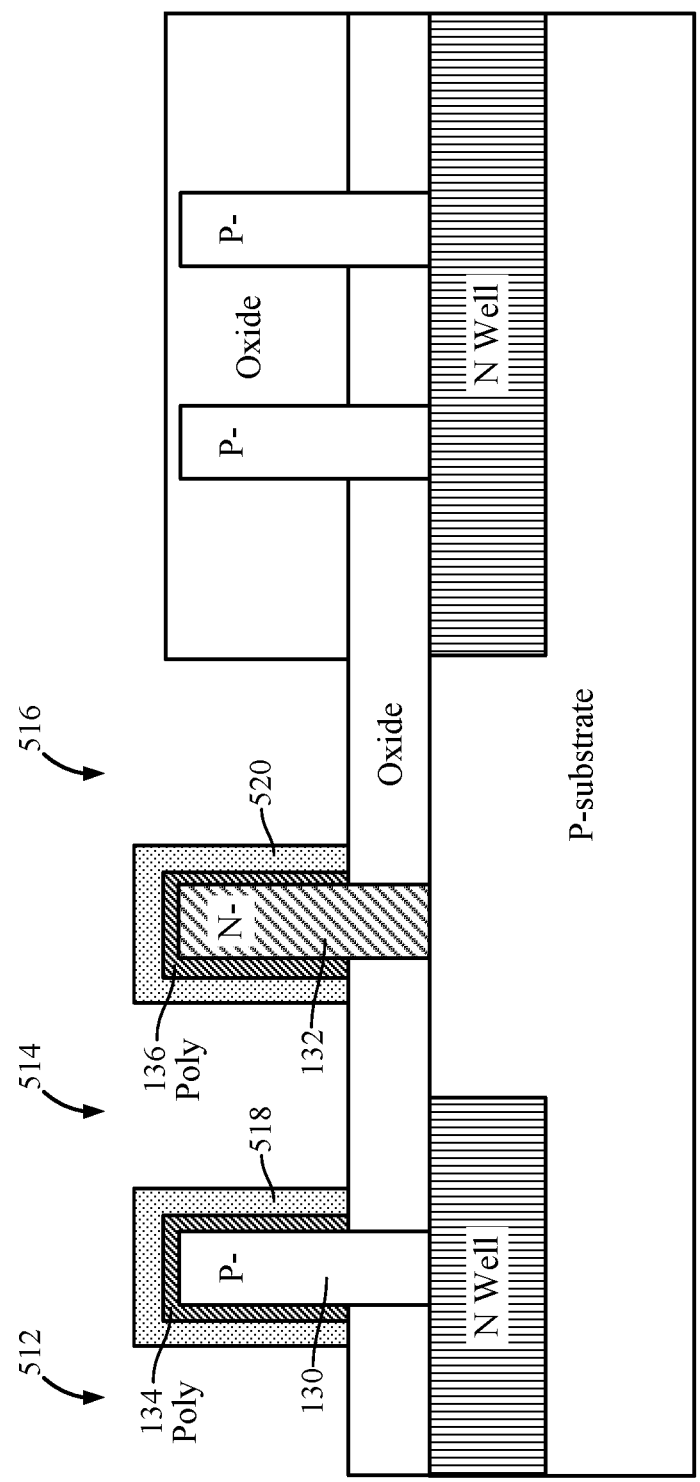
Figure 5H:
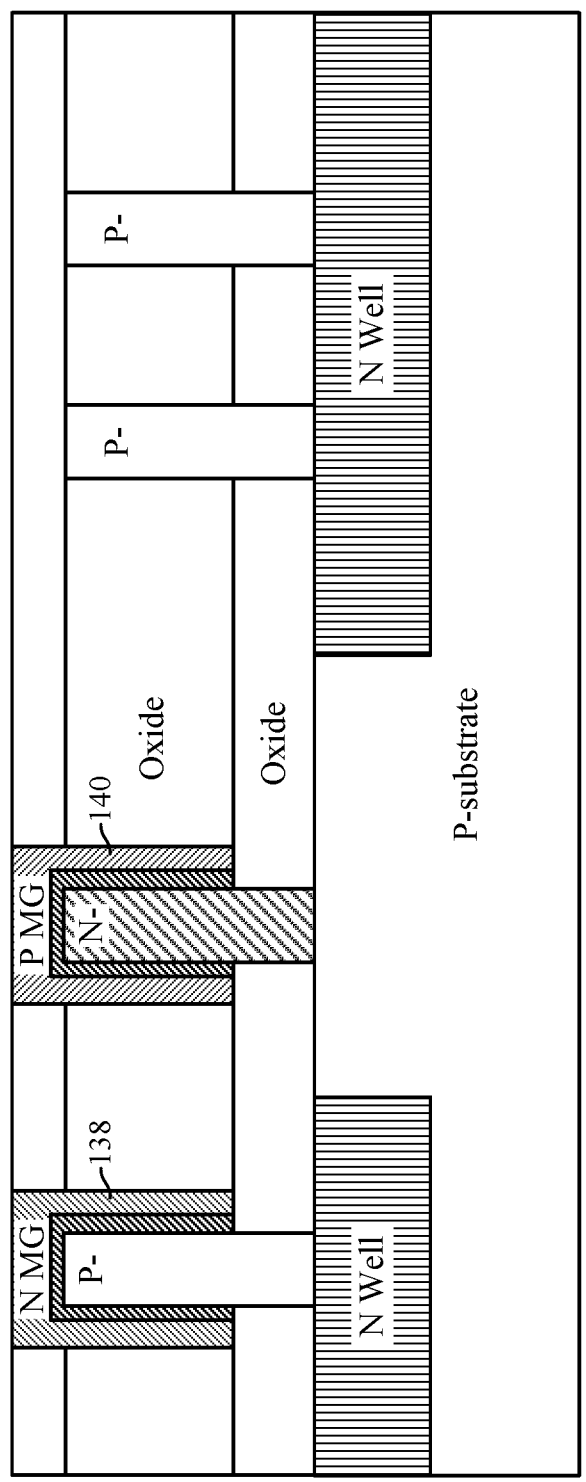
Figure 5I:
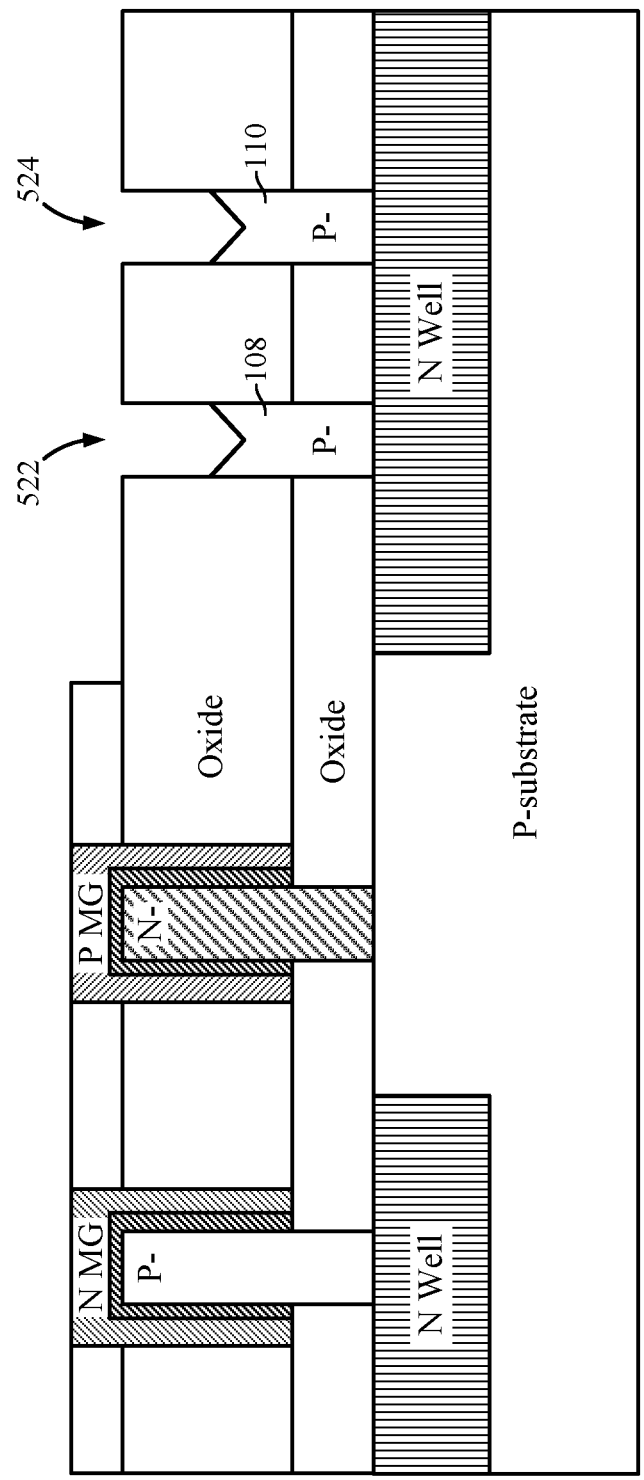
Figure 5J:
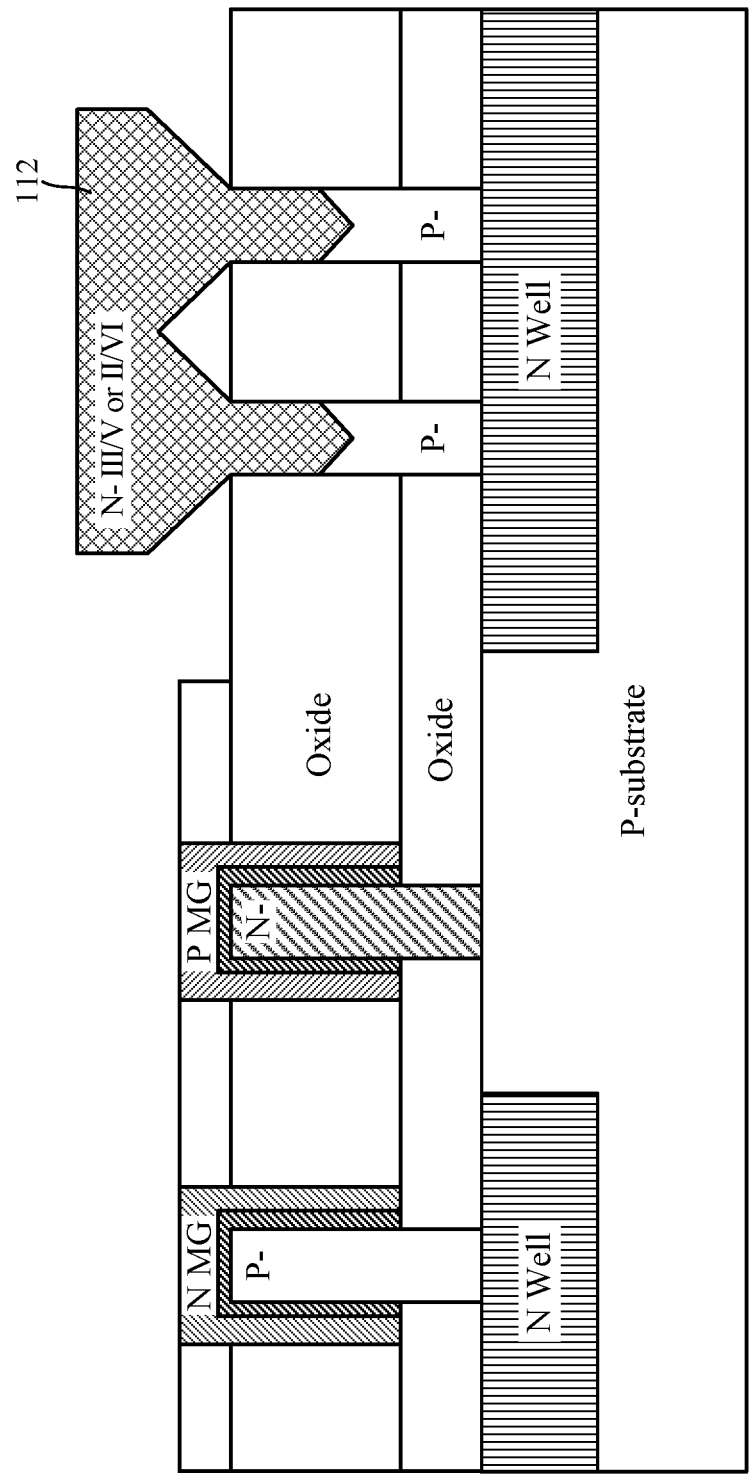
Figure 5K:
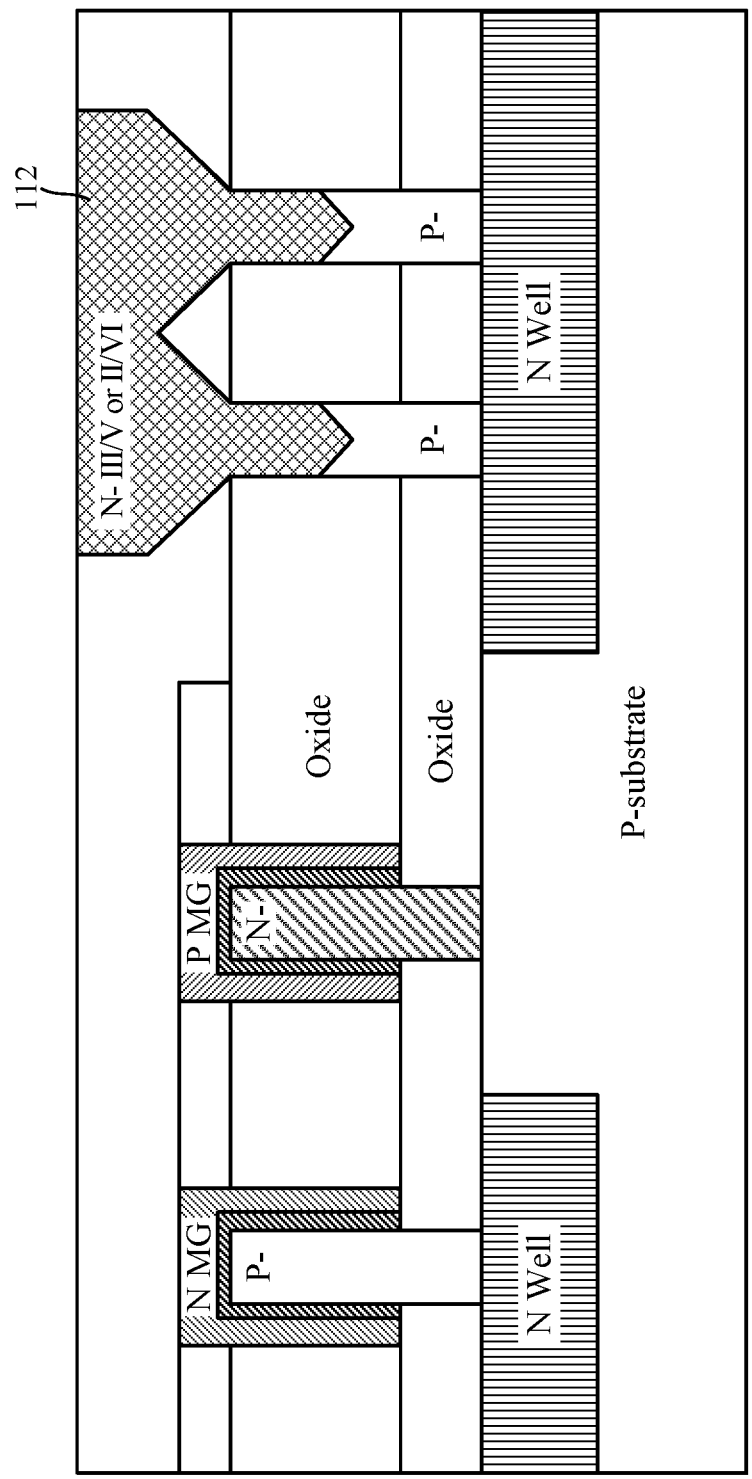
Figure 5L:
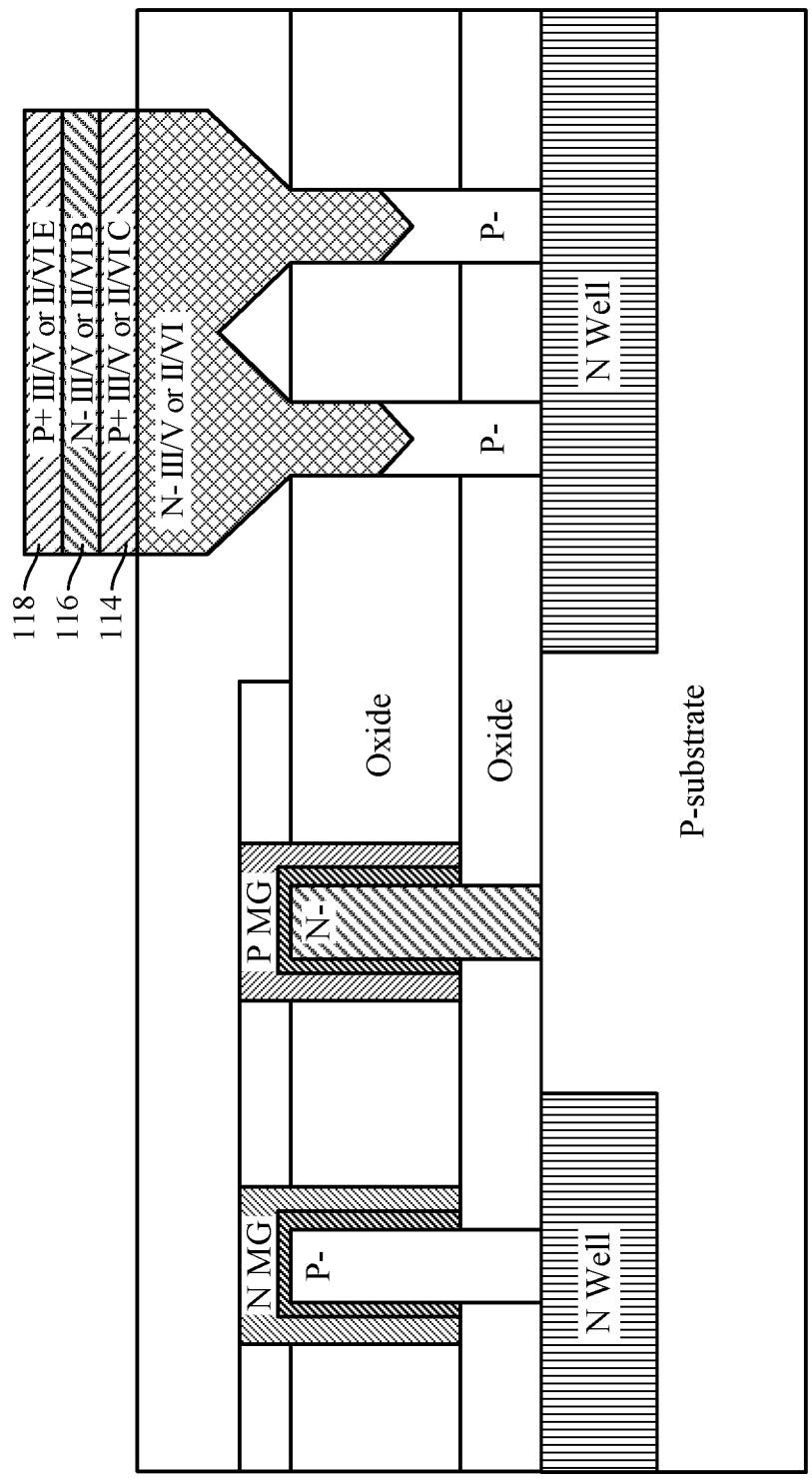
Figure 5M:
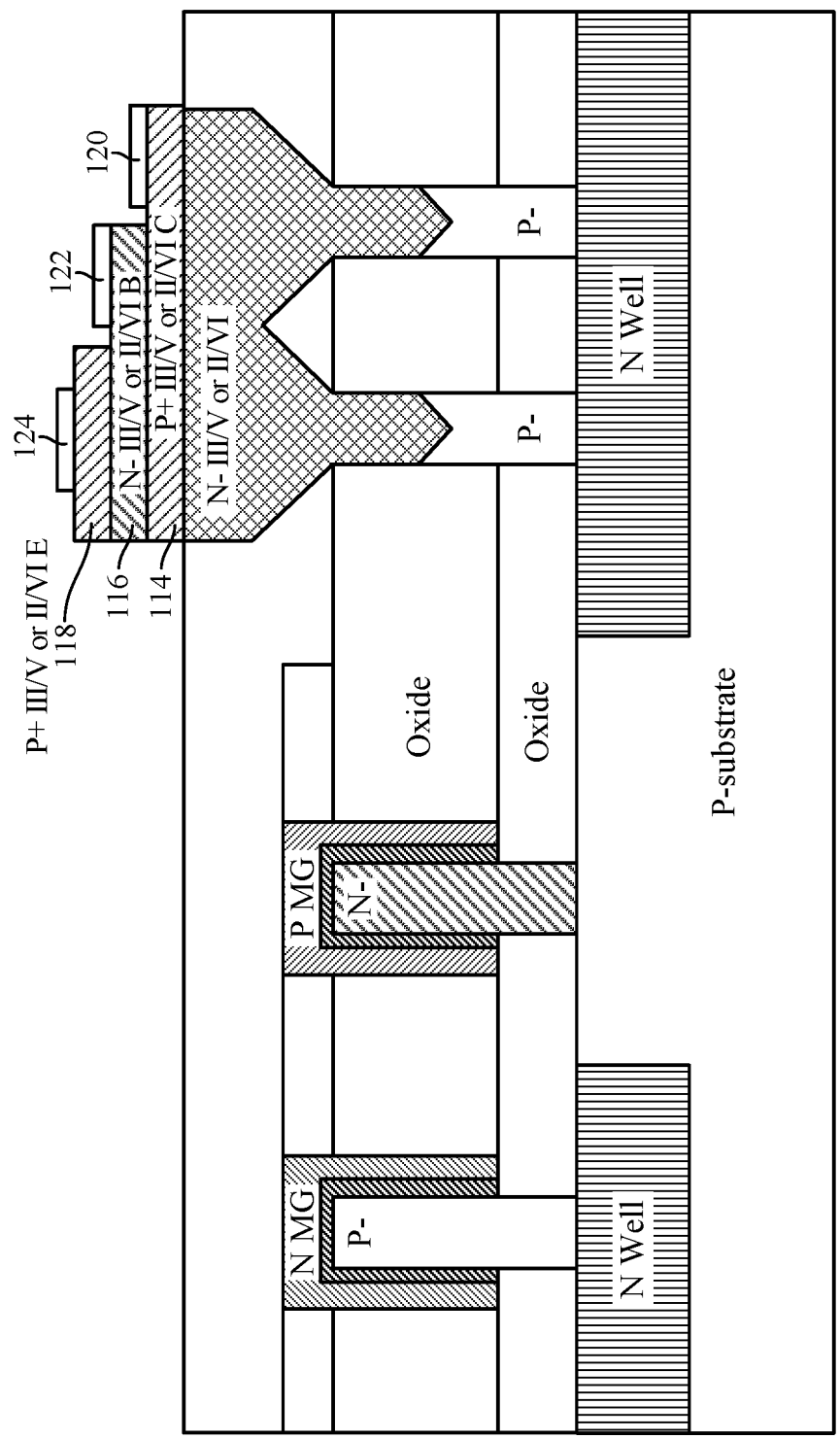
Figure 5N:
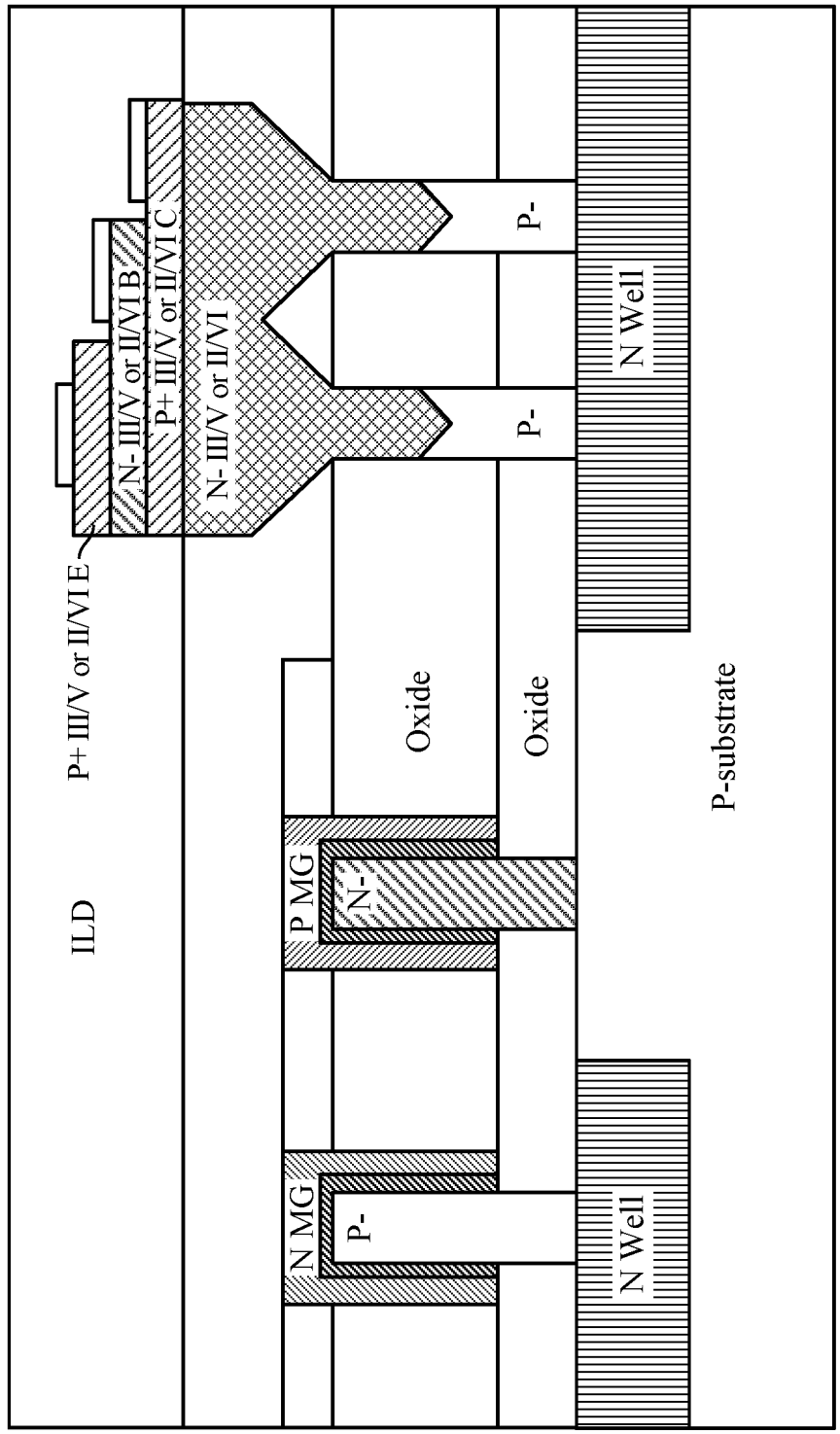
Figure 5O:
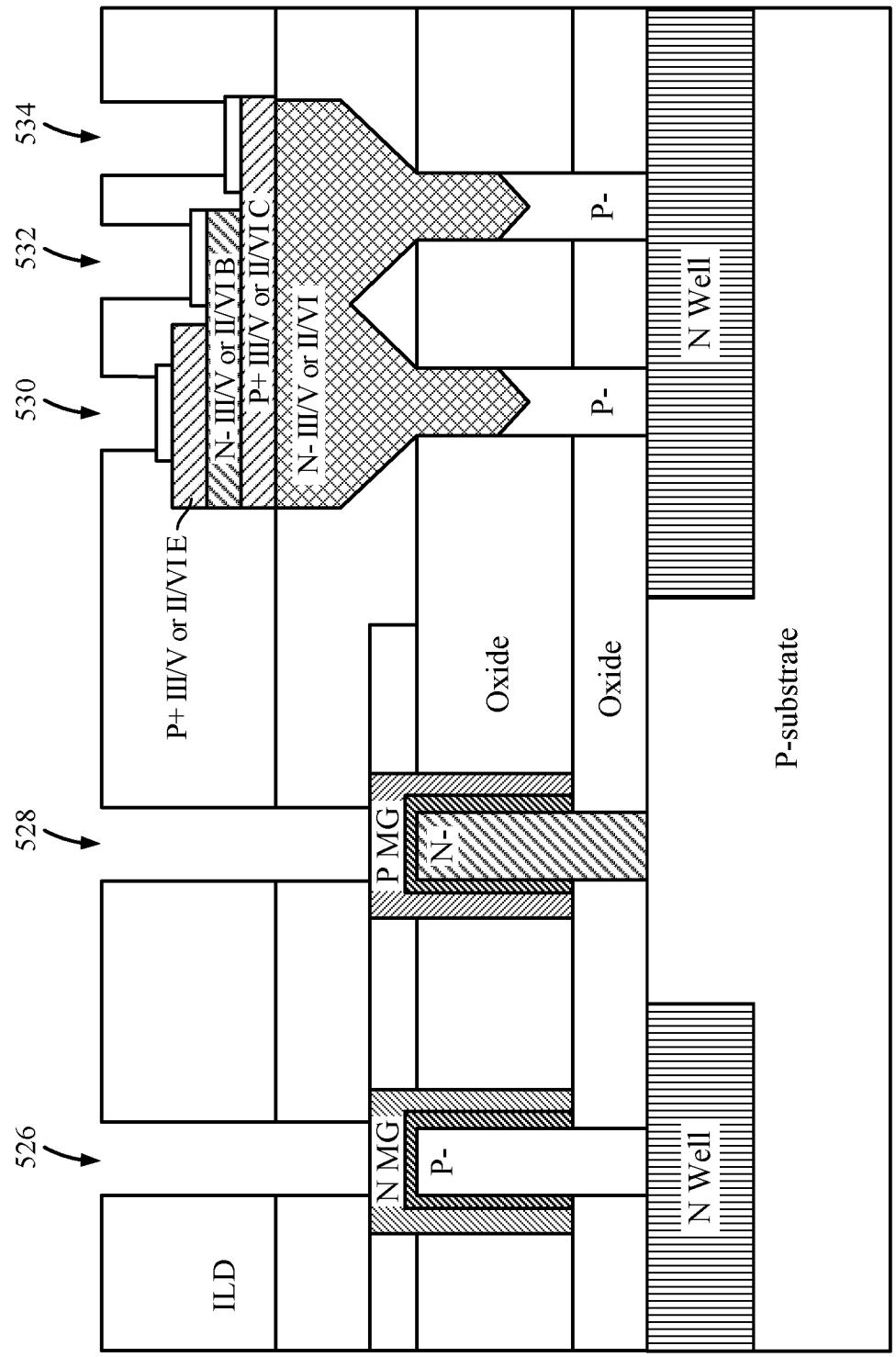
Figure 5P:
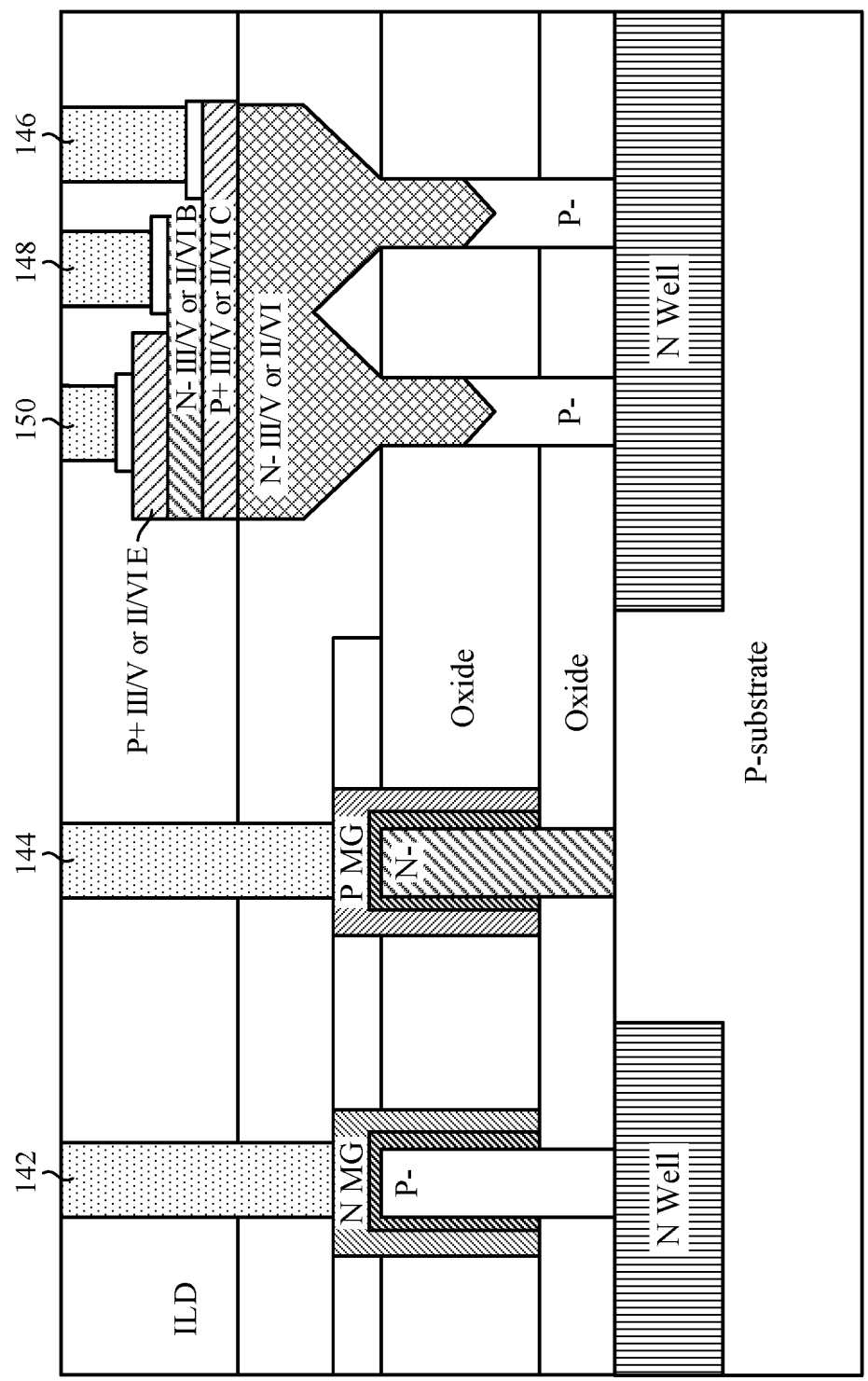

FIGS. 5A-5P illustrate example processes for fabricating the semiconductor device 100 of FIG. 1, in accordance with certain aspects of the present disclosure. Although these processes are illustrated and described herein only for semiconductor device 100, the reader will understand that similar processes can be followed for fabricating any of semiconductor devices 200, 300, and 400 by making appropriate adjustments and/or substitution of materials thereto. As illustrated in FIG. 5A, a p-type semiconductor region 502 (e.g., P-semiconductor) may be formed over a substrate 106 and the N well regions 126 and 128. The p-type semiconductor region 502 is used to form the fins 130, 108, and 110 of the semiconductor device 100, as described in more detail herein.

As illustrated in FIG. 5B, photoresist (PR) regions 504 and 506 are then formed above the semiconductor region 502, and the N-semiconductor region 508 is formed via implantation, after which the PR regions 504 and 506 are stripped. As illustrated in FIG. 5C, a silicon nitride (SiN) hard mask (HM) layer 510 is formed over the P-semiconductor regions 502 and the N-semiconductor region 508.

As illustrated in FIG. 5D, fins 130, 132, 108 and 110 are formed via PR patterning and etching. Oxide is then deposited adjacent to the fins 130, 132, 108 and 110, after which a chemical mechanical planarization (CMP) process is performed, as illustrated in FIG. 5E. As illustrated in FIG. 5F, the SiN HM layer 510 is subsequently removed, and the oxide region is etched to form shallow trench isolation (STI) regions 512, 514, and 516.

As illustrated in FIG. 5G, the oxide layers 134 and 136 are deposited (or grown) around the fins 130 and 132, after which dummy poly regions 518 and 520 are formed. Oxide is then deposited to fill the STI regions 512, 514, and 516, after which CMP is performed. The dummy poly regions 518 and 520 are then removed, and high-k/metal gate (HK/MG) material is then deposited to form n-type and p-type metal gate regions 138 and 140, forming the FinFET CMOS device 102, as illustrated in FIG. 5H.

As illustrated in FIG. 5I, photolithography and etching of the oxide are performed, followed by etching of the fins 108 and 110 to create trenches 522 and 524. As illustrated in FIG. 5J, the support layer 112 is formed via, for example, an epitaxial growth process of a compound semiconductor.

As illustrated in FIG. 5K, oxide is then deposited, and CMP is performed. At this stage, the compound semiconductor regions 114, 116, and 118 are formed via, for example, an epitaxial growth process, as illustrated in FIG. 5L. As illustrated in FIG. 5M, the compound semiconductor regions 114, 116, and 118 are patterned via a photo and etching process, and contact metal layers 120, 122, and 124 are formed. Inter-layer dielectric (ILD) is then deposited, as illustrated in FIG. 5N, and CMP is performed.

As illustrated in FIG. 5O, contact patterning is then performed via a photo and etching process to form trenches 526, 528, 530, 532, and 534. Contact material is then deposited in the trenches 526, 528, 530, 532, and 534 and CMP to form the contacts 142, 144, 146, 148, and 150, as illustrated in FIG. 5P.

Figure 6:
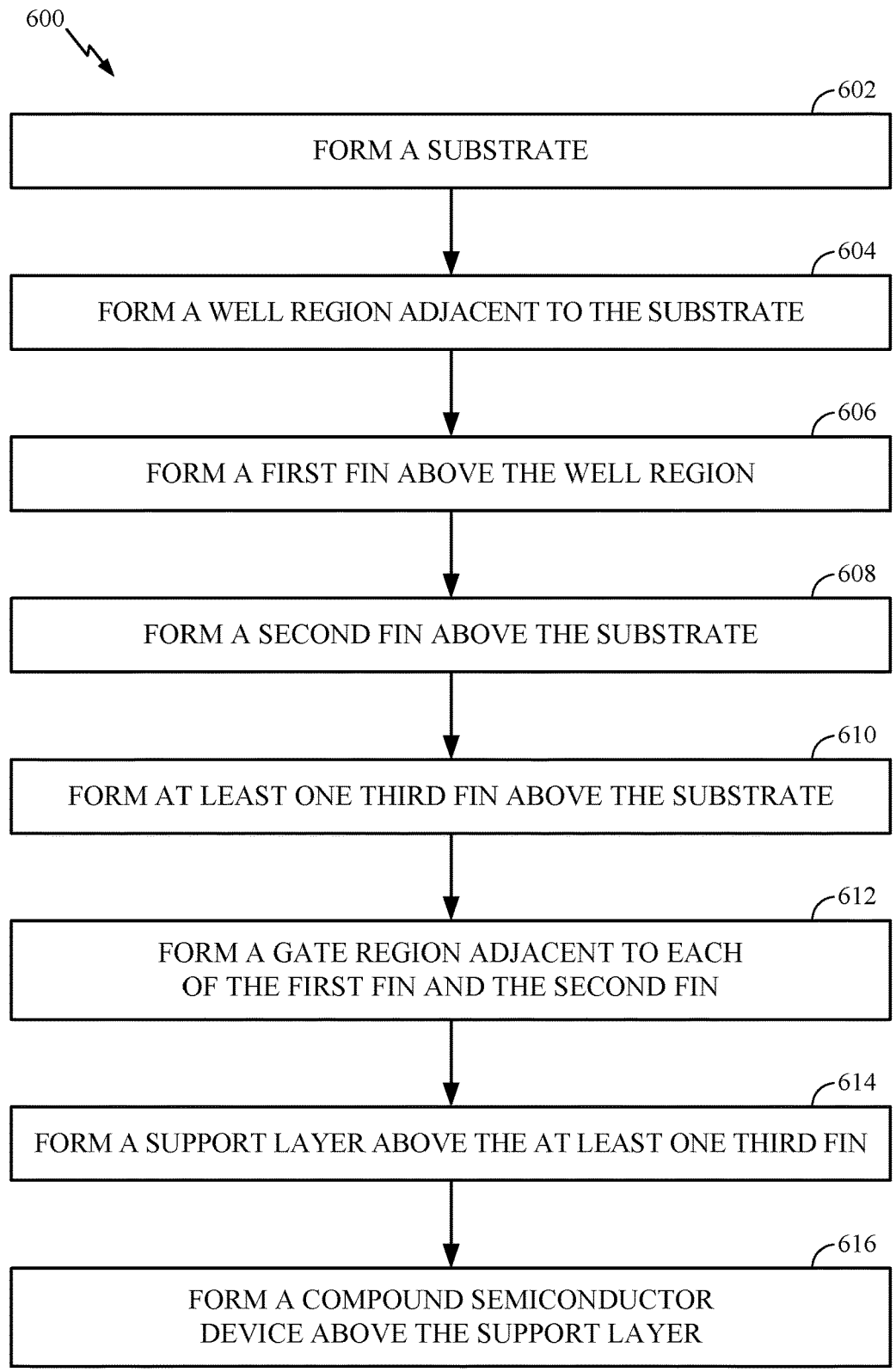
FIG. 6 illustrates example operations for fabricating a semiconductor device, in accordance with certain aspects of the present disclosure.

FIG. 6 is a flow diagram of example operations 600 for fabricating a semiconductor device, in accordance with certain aspects of the present disclosure. The operations 600 may be performed, for example, by a semiconductor processing chamber.

The operations 600 begin, at block 602, by forming a substrate (e.g., substrate 106), and at block 604, forming a well region (e.g., N well region 128) adjacent to the substrate. At block 606, a first fin (e.g., fin 130) is formed above the well region, and at block 608, a second fin (e.g., fin 132) is formed above the substrate. At block 610, at least one third fin (e.g., fins 108 and 110) is formed above the substrate. At block 612, a gate region (e.g., metal gate regions 138 and 140) is formed adjacent to each of the first fin and the second fin, and at block 614, a support layer (e.g., support layer 112) is formed above the at least one third fin. At block 616, a compound semiconductor device (e.g., compound semiconductor device 104) is formed above the support layer.

According to certain aspects, the support layer comprises a compound semiconductor material. In some cases, the compound semiconductor material includes a group III/V semiconductor or a group II/VI semiconductor.

According to certain aspects, the compound semiconductor device includes a group III/V semiconductor or a group II/VI semiconductor.

According to certain aspects, the compound semiconductor device includes a bipolar transistor. In some case, the bipolar transistor is a heterojunction bipolar transistor (HBT). For certain aspects, the HBT includes a first compound semiconductor region, a second compound semiconductor region, and a third compound semiconductor region. The second compound semiconductor region may be between the first compound semiconductor region and the second compound semiconductor region. For certain aspects, the first compound semiconductor region and the third compound semiconductor region comprise a first doping type. For certain aspects, the second compound semiconductor region comprises a second doping type that is different from the first doping type.

According to certain aspects, the well region, the first fin, the second fin, and the gate region disposed adjacent to each of the first fin and the second fin form a complementary metal-oxide-semiconductor (CMOS) device.

According to certain aspects, the gate region disposed adjacent to each of the first fin and the second fin includes a first non-insulative gate region disposed adjacent to the first fin and a second non-insulative gate region disposed adjacent to the second fin. In some cases, the first non-insulative gate region and the second non-insulative gate region have different doping types. For certain aspects, the first non-insulative gate region is disposed adjacent to at least three sides of the first fin, and the second non-insulative gate region is disposed adjacent to at least three sides of the second fin. For certain aspects, the gate region disposed adjacent to each of the first fin and the second fin further includes: (1) a first gate dielectric region disposed between the first non-insulative gate region and the first fin; and (2) a second gate dielectric region disposed between the second non-insulative gate region and the second fin. For certain aspects, the first non-insulative gate region and the second non-insulative gate region comprise metal gate regions.

According to certain aspects, the semiconductor device further includes another well region disposed adjacent to the substrate. In this case, the at least one third fin may be disposed above the other well region. For certain aspects, the well region and the other well region are disposed above different portions of the substrate.

According to certain aspects, the at least one third fin has a first doping type, and the support layer has a second doping type. The first doping type may be different from the second doping type.

According to certain aspects, the at least one third fin comprises two fins (e.g., fins 108 and 110). In this case, the support layer may be disposed above the two fins.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device comprising:
   a substrate;
   a well region disposed adjacent to the substrate;
   a first fin disposed above the well region;
   a second fin disposed above the substrate;
   a gate region disposed adjacent to each of the first fin and the second fin;
   at least one third fin disposed above the substrate;

a support layer disposed above the at least one third fin; and a compound semiconductor device disposed above the support layer.

2. The semiconductor device of claim 1, wherein the support layer comprises a compound semiconductor material.

3. The semiconductor device of claim 2, wherein the compound semiconductor material comprises a group III/V semiconductor, or a group II/VI semiconductor.

4. The semiconductor device of claim 1, wherein the compound semiconductor device comprises group III/V semiconductor, or a group II/VI semiconductor.

5. The semiconductor device of claim 1, wherein the compound semiconductor device comprises a bipolar transistor.

6. The semiconductor device of claim 5, wherein the bipolar transistor comprises a heterojunction bipolar transistor (HBT).

7. The semiconductor device of claim 6, wherein the HBT comprises:
  a first compound semiconductor region;
  a second compound semiconductor region; and
  a third compound semiconductor region, wherein the second compound semiconductor region is between the first compound semiconductor region and the second compound semiconductor region.

8. The semiconductor device of claim 7, wherein the first compound semiconductor region and the third compound semiconductor region comprise a first doping type, and wherein the second compound semiconductor region comprises a second doping type that is different from the first doping type.

9. The semiconductor device of claim 1, wherein the well region, the first fin, the second fin, and the gate region disposed adjacent to each of the first fin and the second fin form a complementary metal-oxide-semiconductor (CMOS) device.

10. The semiconductor device of claim 1, wherein the gate region disposed adjacent to each of the first fin and the second fin comprises:
  a first non-insulative gate region disposed adjacent to the first fin; and
  a second non-insulative gate region disposed adjacent to the second fin, the first non-insulative gate region and the second non-insulative gate region having different doping types.

11. The semiconductor device of claim 10, wherein:
  the first non-insulative gate region is disposed adjacent to at least three sides of the first fin; and
  the second non-insulative gate region is disposed adjacent to at least three sides of the second fin.

12. The semiconductor device of claim 10, wherein the gate region disposed adjacent to each of the first fin and the second fin further comprises:
  a first gate dielectric region disposed between the first non-insulative gate region and the first fin; and
  a second gate dielectric region disposed between the second non-insulative gate region and the second fin.

13. The semiconductor device of claim 10, wherein the first non-insulative gate region and the second non-insulative gate region comprise metal gate regions.

14. The semiconductor device of claim 1, further comprising:
  another well region disposed adjacent to the substrate, wherein the at least one third fin is disposed above the other well region.

15. The semiconductor device of claim 14, wherein the well region and the other well region are disposed above different portions of the substrate.

16. The semiconductor device of claim 1, wherein the at least one third fin has a first doping type and wherein the support layer has a second doping type, the first doping type being different from the second doping type.

17. The semiconductor device of claim 1, wherein the at least one third fin comprises two fins, the support layer being disposed above the two fins.

18. A semiconductor device comprising:
  a substrate;
  a well region disposed adjacent to the substrate;
  a first fin disposed above the well region;
  a second fin disposed above the substrate, the first fin and the second fin having different doping types;
  a first non-insulative gate region disposed adjacent to the first fin, the first non-insulative gate region having a different doping type than the first fin;
  a second non-insulative gate region disposed adjacent to the second fin, the second non-insulative gate region having a different doping type than the second fin;
  at least one third fin disposed above the substrate;
  a support layer disposed above the at least one third fin; and
  a compound semiconductor device disposed above the support layer.

19. The semiconductor device of claim 18, wherein the support layer comprises a compound semiconductor material.

20. The semiconductor device of claim 18, wherein the compound semiconductor device comprises a bipolar transistor.

21. The semiconductor device of claim 20, wherein the bipolar transistor comprises a heterojunction bipolar transistor (HBT).

22. The semiconductor device of claim 21, wherein the HBT comprises:
  a first compound semiconductor region;
  a second compound semiconductor region; and
  a third compound semiconductor region, wherein the second compound semiconductor region is between the first compound semiconductor region and the second compound semiconductor region.

23. The semiconductor device of claim 22, wherein the first compound semiconductor region and the third compound semiconductor region comprise a first doping type, and the second compound semiconductor region comprises a second doping type that is different from the first doping type.

24. The semiconductor device of claim 18, further comprising:
  a first gate dielectric region disposed between the first non-insulative gate region and the first fin; and
  a second gate dielectric region disposed between the second non-insulative gate region and the second fin.

25. The semiconductor device of claim 18, wherein the first non-insulative gate region and the second non-insulative gate region comprise metal gate regions.

26. The semiconductor device of claim 18, further comprising:
  another well region disposed adjacent to the substrate, wherein the at least one third fin is disposed above the other well region.

27. The semiconductor device of claim 26, wherein the well region and the other well region are disposed above different portions of the substrate.

28. The semiconductor device of claim 18, wherein the at least one third fin has a first doping type and wherein the support layer has a second doping type, the first doping type being different from the second doping type.

29. The semiconductor device of claim 18, wherein the at least one third fin comprises two fins, the support layer being disposed above the two fins.

* * * * *